United States Patent
Hamilton, Jr. et al.

[11] Patent Number: 5,449,927
[45] Date of Patent: Sep. 12, 1995

[54] MULTILAYER BUFFER STRUCTURE INCLUDING II-VI COMPOUNDS ON A SILICON SUBSTRATE

[75] Inventors: William J. Hamilton, Jr., Ventura; Scott M. Johnson, Santa Barbara; William L. Ahlgren, Goleta, all of Calif.

[73] Assignee: Santa Barbara Research Center, Goleta, Calif.

[21] Appl. No.: 245,147

[22] Filed: May 16, 1994

[51] Int. Cl.⁶ .......................................... H01L 29/161
[52] U.S. Cl. ................................. 257/188; 257/190; 257/191; 257/200
[58] Field of Search ................ 257/190, 188, 200, 191

[56] References Cited

U.S. PATENT DOCUMENTS

| | | | |
|---|---|---|---|
| 3,963,539 | 6/1976 | Kemlage et al. | 257/190 |
| 4,558,336 | 12/1985 | Chang et al. | 257/190 |
| 4,994,867 | 2/1991 | Biegelsen | 257/190 |
| 5,302,232 | 4/1994 | Ebe et al. | 257/190 |
| 5,306,386 | 4/1994 | de Lyon | 156/612 |

FOREIGN PATENT DOCUMENTS

| | | | |
|---|---|---|---|
| 55-115380 | 9/1980 | Japan | 257/190 |
| 62-130568 | 6/1987 | Japan | 257/188 |

OTHER PUBLICATIONS

Goela et al., "Growth of CdZnTe on Si by low-pressure chemical vapor deposition," *Applied Physics Letters*, 51 (12), Sep. 1987, pp. 928–930.
Kay et al., "HgCdTe photovoltaic detectors on Si substrates", *Applied Physics Letters* 51 (26), Dec. 1987, pp. 2211–2212.

*Primary Examiner*—Jerome Jackson
*Assistant Examiner*—Courtney A. Bowers
*Attorney, Agent, or Firm*—W. C. Schubert; W. K. Denson-Low

[57] ABSTRACT

A layer (32) of a HgCdTe compound epitaxially contacts a buffer structure, which in turn epitaxially contacts a silicon substrate (22). The buffer structure is formed of II-VI compounds, and preferably includes at least one layer (24) of a ZnSeTe compound epitaxially contacting the silicon substrate (22) and a layer (30) of a CdZnTe compound overlying the ZnSeTe compound layer (24). The ZnSeTe compound layer (24) may be provided as a single graded layer having a composition of ZnSe adjacent to the silicon and a composition of ZnTe remote from the silicon, or as two distinct sublayers with a ZnSe sublayer (26) adjacent to the silicon substrate (22) and a ZnTe sublayer (28) remote from the silicon substrate (22).

17 Claims, 2 Drawing Sheets

MULTILAYER BUFFER STRUCTURE INCLUDING II-VI COMPOUNDS ON A SILICON SUBSTRATE

BACKGROUND OF THE INVENTION

This invention relates to multilayer semiconductor structures, and, more particularly, to a semiconductor structure having a buffer structure between the active material and the substrate.

A common construction used in a semiconductor device is an active semiconductor material supported upon a substrate of another material. The compositions of the active material and the substrate are selected for the particular purpose of the device, and a wide variety of combinations are possible. For example, the active material is often a doped II-VI or III-VI semiconductor compound, and the substrate is often silicon or gallium arsenide. The active material and the substrate may also be multilayered structures, chosen to achieve particular functions.

The crystalline relations and defect structures of the active material and the substrate are important factors in the operability of the semiconductor device. The active material and the substrate have inherent defect structures that are produced during their growth or deposition. The active material is usually deposited so as to be epitaxially related to the substrate material at their interface. There is therefore continuity of lattice planes across the interface between the active layer and the substrate. However, because the lattice parameters of the active material and the substrate are not usually the same, the epitaxial relation results in a state of strain being present at and adjacent to the interface. Differences in thermal expansion coefficients between adjacent phases produce similar states of strain if the structure is heated or cooled during fabrication or service.

The strain state at and near the interface can affect the operation of the semiconductor device. Additionally, the strain state can sometimes be relieved by the production of defects at the interface. The defects inherently present in the constituents and those produced due to the epitaxially induced strain state can adversely affect the performance of the semiconductor device.

It is therefore usually desirable to minimize the strain state and unwanted defect structure in the semiconductor device. One approach to achieving this end is to place a buffer layer between the active material and the substrate. The buffer layer provides epitaxial continuity, but has a lattice parameter intermediate those of the active material and the substrate. Strain and interfacial defects are thereby reduced.

For example, in one type of infrared sensor it is desired to utilize HgCdTe active material epitaxially upon a silicon substrate. HgCdTe has a lattice parameter of 6.46 Angstroms for compositions typically used in infrared detectors, and silicon has a lattice parameter of 5.43 Angstroms. It is not yet possible to deposit the HgCdTe directly onto the silicon to achieve an epitaxial relation because of this large lattice mismatch, and when the deposition is successful there is necessarily a large mismatch strain and a high associated defect density.

To alleviate this problem, it has been the conventional practice to use a gallium arsenide buffer layer between the HgCdTe active material and the substrate. There are, however, several significant drawbacks to this approach. There remains a high defect density. Moreover, if the HgCdTe is deposited by the liquid phase epitaxy technique, the gallium arsenide can dissolve into and contaminate the liquid phase.

An additional CdZnTe layer can be added to the buffer structure between the HgCdTe active material and the gallium arsenide. The CdZnTe layer can block the penetration of defects from the gallium arsenide into the HgCdTe active material. Semiconductor devices made with this substrate/buffer layer/active material structure work well in some applications. However, the defect structure remains excessive for optimal performance of the semiconductor device in other applications. Additionally, there is always the concern with contamination of the liquid phase epitaxy melt, when that approach is used.

There remains a need for an improved approach to the construction of semiconductor devices of the type discussed. The approach should overcome the problems identified in the prior approaches. The present invention fulfills this need, and further provides related advantages.

SUMMARY OF THE INVENTION

The present invention provides a semiconductor article structure and process for its preparation. The approach is particularly useful for structures of II-VI active material on a silicon substrate. The technique achieves at least four important advantages. First, it avoids contamination of the II-VI active material by III-V compounds. Second, it significantly reduces the incidence of defects originating in the lattice mismatch between the active material and the substrate. Third, thermal mismatch strains are reduced due to greater similarity in the thermal expansion coefficients of the layers. Fourth, it reduces costs of production of the semiconductor articles by a significant amount. The approach of the invention can be implemented using process technology known for use in other contexts.

In accordance with the invention, a semiconductor article comprises a silicon substrate and a buffer layer overlying the substrate. The buffer layer includes at least one layer of a II-VI compound epitaxially contacting the silicon substrate, each II-VI compound having a lattice parameter greater than that of silicon. There is a layer of a CdZnTe compound epitaxially contacting the at least one layer of the II-VI compound, the CdZnTe compound having a lattice parameter greater than that of the II-VI compound of the at least one layer of a II-VI compound that lies adjacent to the layer of a CdZnTe compound. Overlying the buffer layer is a layer of a HgCdTe compound epitaxially contacting the CdZnTe layer, the HgCdTe compound having a lattice parameter about the same as that of the CdZnTe compound at a location immediately adjacent to the HgCdTe compound.

The II-VI compound in the buffer layer may be provided either as a single graded layer or at least two layers. In an example of the first case, the II-VI compound is provided in a graded layer of ZnSeTe, the layer having a composition of ZnSe adjacent to the silicon substrate and a composition of ZnTe adjacent to the layer of CdZnTe compound. Stated alternatively, the graded layer comprises a compound of the form $ZnSe_xTe_{1-x}$, where x is 1 adjacent to the silicon substrate and decreases with increasing distance from the silicon substrate. In an example of the second case, the II-VI compound is provided in two layers, a first II-VI sublayer having a composition of ZnSe adjacent to the silicon substrate, and a second II-VI sublayer having a composition of ZnTe adjacent to the layer of CdZnTe compound. In these and other cases, there can be further grading within the region of the II-VI layer by adding Cd so as to more closely match the lattice parameter of the CdZnTe compound.

As used herein, compound compositions expressed in forms such as ZnSe, ZnTe, CdZnTe, and the like are presented as nominal compositions. There may be variations in composition as are normally found in the preparation of semiconductor compositions.

The present invention eliminates the use of gallium arsenide in the buffer structure, as has been the practice in the past. Elimination of the gallium arsenide has the important consequences that it is not present to potentially contaminate the liquid phase used to deposit HgCdTe or other compounds by liquid phase epitaxy. The use of the buffer layer of the invention that utilizes II-VI compounds to reduce interfacial lattice mismatches also reduces the defect density resulting from mismatches. The performance of the final semiconductor device is thereby improved. The cost of the semiconductor products is also reduced, inasmuch as the cost of silicon wafers with gallium arsenide layers is quite high. The ability to perform the entire deposition procedure in a single reactor also reduces its cost.

Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
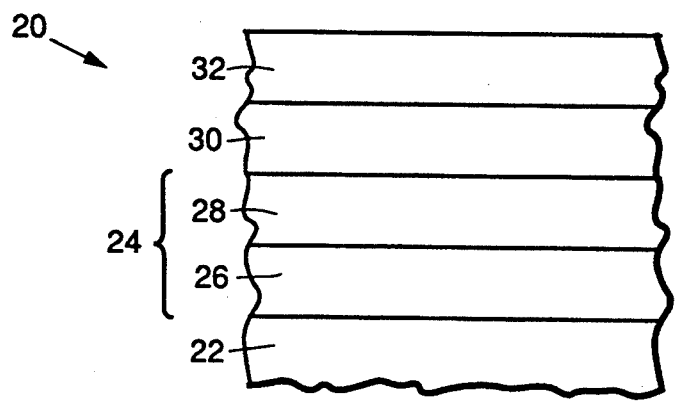
FIG. 1 is a schematic elevational view of a first preferred embodiment of the semiconductor article.
Figure 2:
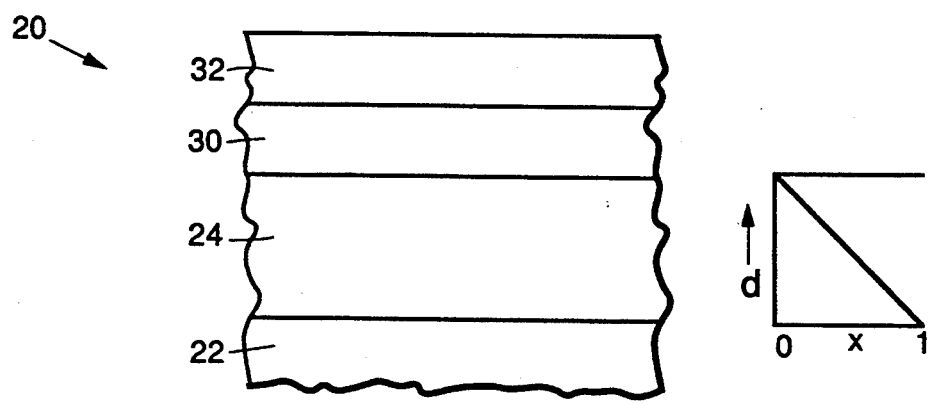
FIG. 2 is a schematic elevational view of a second preferred embodiment of the semiconductor article, with an inset illustrating the variation of a compositional parameter in the II-VI layer structure.
Figure 3:
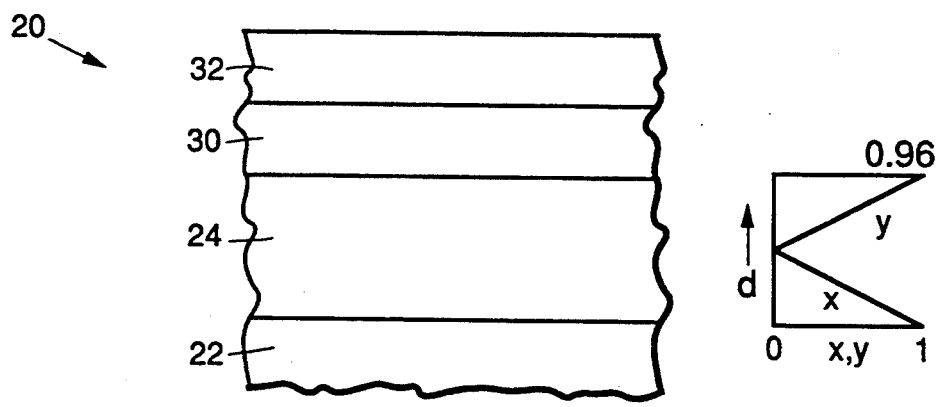
FIG. 3 is a schematic elevational view of a third preferred embodiment of the semiconductor article, with an inset illustrating the variation of two compositional parameters in the II-VI layer structure.
Figure 4:
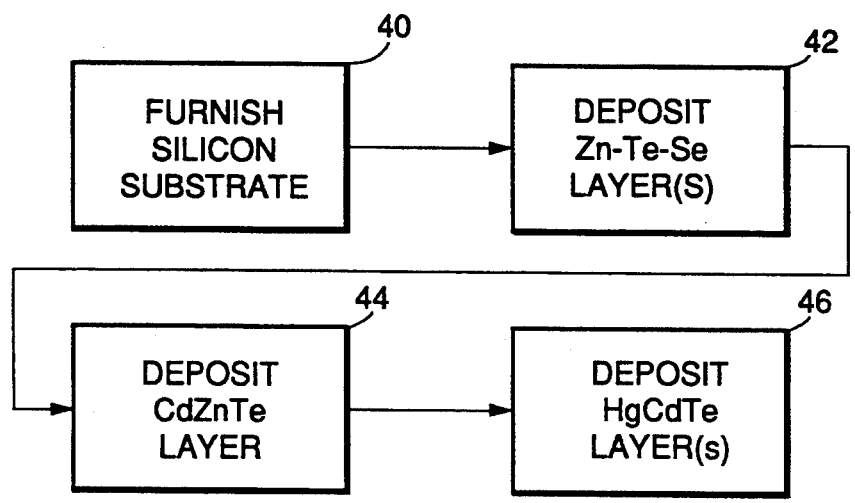
FIG. 4 is a process flow diagram for the preparation of the embodiments of the invention.

FIGS. 1-3 illustrate three embodiments of the invention. These depictions are not drawn to scale. FIG. 4 illustrates a process for practicing the invention.

Referring to FIGS. 1-3, a semiconductor article 20 includes a single-crystal silicon substrate 22. The substrate 22 preferably has a crystallographic orientation of [100]. (All crystallographic orientations herein are expressed relative to the surface normal of the substrate or layer.) In this orientation, the effective lattice parameter of silicon for the purposes of lattice mismatch determinations is 5.43 Angstroms. Such substrates 22 can be grown by conventional techniques and are available commercially from a variety of sources, such as Semiconductor Processing Company. In one embodiment, the silicon substrate 22 is a wafer about 500-1000 micrometers thick.

Overlying the substrate 22 is a II-VI layer structure 24. The II-VI layer structure may be formed of two or more sublayers, or may be a single layer. FIG. 1 illustrates a II-VI layer structure 24 formed of two sublayers, and FIGS. 2-3 illustrate a II-VI layer structure 24 formed of a single layer having a graded composition.

Referring to FIG. 1, the II-VI layer structure 24 includes a first II-VI sublayer 26 having a composition of ZnSe. The ZnSe sublayer 26 preferably has a crystallographic orientation of [100], and has an epitaxial relationship to the underlying silicon substrate 22. In this orientation, the effective lattice parameter of the ZnSe sublayer 26 for the purposes of lattice mismatch determinations is 5.66 Angstroms. The ZnSe sublayer 26 may be any operable thickness. The ZnSe sublayer 26 is preferably from about 0.01 micrometer to about 1 micrometer thick, and most preferably about 0.5 micrometer thick. The ZnSe sublayer 26 is readily formed in situ on the silicon substrate by vapor phase deposition. The deposition of ZnSe on silicon is well known, and is described, for example, in the publication of Lee et al., "Improvements in the heteroepitaxy of GaAs on Si by incorporating a ZnSe buffer layer," Appl. Phys. Lett., Vol. 59, no. 2, pages 207-209 (1991) and the publication of Bringans et al., "Use of ZnSe as an interlayer for GaAs growth on Si," Appl. Phys. Lett., Vol. 61, No. 2, pages 195-197 (1992).

The II-VI layer structure 24 of FIG. 1 further includes a second II-VI sublayer 28 having a composition of ZnTe. The ZnTe sublayer 28 preferably has a crystallographic orientation of [100], and has an epitaxial relationship to the underlying ZnSe sublayer 26. In this orientation, the effective lattice parameter of the ZnTe sublayer 28 for the purposes of lattice mismatch determinations is 6.08 Angstroms. The ZnTe sublayer 28 may be any operable thickness, is preferably from about 0.1 micrometer to about 1 micrometer thick, and is most preferably about 0.5 micrometer thick. The ZnTe sublayer 28 is readily formed in situ on the silicon substrate by vapor phase deposition. The deposition of ZnTe is well known, and is described, for example, in the publication of H. Shtrikman et al., J. Electr. Mat., Vol. 17, page 105 (1988). In a variation of this approach, the second sublayer 28 may have a graded composition with a composition of ZnTe adjacent to the first sublayer 26 and a composition of CdZnTe adjacent to the next overlying layer.

FIG. 2 shows another form of the II-VI layer structure 24. Here the layer structure 24 has a graded composition of the form $ZnSe_xTe_{1-x}$, where x is 1 adjacent to the silicon substrate and decreases with increasing distance from the silicon substrate 22. The inset graph in FIG. 2 shows x=1 adjacent to the silicon substrate 22 and x decreasing with increasing distance from the silicon substrate 22. In this preferred case, x decreases to 0 at locations within the layer structure 24 most remote from the silicon substrate 22. That is, adjacent to the silicon substrate 22 the composition of the layer structure 24 is ZnSe, and at the most remote location from the silicon substrate the composition is ZnTe. The inset graph shows a linearly decreasing value of x with increasing distance. In practice, it may not be possible or desirable to have a linear variation. Any type of variation of x with distance is acceptable within the constraints of the above limitations.

The graded composition approach of FIG. 2 has the advantage over the stepped composition approach of FIG. 1 that the interface between the sublayers 26 and 28, present in FIG. 1, is eliminated. This interface is a potential source of linear defects that originate at the interface. The approach of FIG. 2 has the disadvantage that it is more difficult to implement and sometimes requires a specialized vapor deposition apparatus. However, graded compositions within layers are well known and widely used in other applications, see, for example, the publication of P. F. Hopkins et al., *J. Cryst. Growth*, Vol. 127, page 798 (1993).

FIG. 3 shows another form of the II-VI layer structure 24. Here, a single layer has a graded composition of the form $Cd_yZn_{1-y}Se_xTe_{1-x}$, where x is 1 adjacent to the silicon substrate and decreases with increasing distance from the silicon substrate 22, and y increases from 0 at a location close to (or at) the silicon substrate 22 to a larger value at a distance most remote from the silicon substrate 22. The inset graph in FIG. 3 shows x=1 adjacent to the silicon substrate 22 and x decreasing with increasing distance from the silicon substrate 22. In this preferred case, x decreases to 0 at locations within the layer structure 24 remote from the silicon substrate 22.

The inset graph of FIG. 3 also shows y=0 adjacent to the silicon substrate 22 and at some small distance from the silicon substram 22. At larger distances from the silicon substrate 22, y increases to some larger number, approaching a value of 0.96 at the greatest distances from the silicon substrate 22. That is, adjacent to the silicon substrate 22 the composition of the layer structure 24 is ZnSe. At the most remote location from the silicon substrate the composition is selected so that the lattice parameter closely matches the overlying active layer to be described subsequently. For example, the composition of the layer structure 24 remote from the silicon substrate 22 is preferably $Cd_{.96}Zn_{.04}Te$, which closely matches the lattice parameter of HgCdTe compositions typically used in infrared detector applications. The inset graph shows a linearly decreasing value of x with increasing distance. In practice, it may not be possible or desirable to have a linear variation. Any type of variation of x with distance is acceptable within the constraints of the above limitations. Similarly, the graph shows a linear variation in y, and a particular initial point of increase and final value of y. Any type of variation of y with distance is acceptable within the constraints of the above limitations.

Adding Cd to the layer structure 24 with increasing distance gradually adjusts the lattice parameter of the layer structure 24 to more closely approximate that of the next layer. A similar gradation in Cd content may be used in the sublayer 28 of FIG. 1.

In each of the semiconductor articles 20 of FIGS. 1-3, a CdZnTe layer 30 overlies the II-VI layer structure 24. The CdZnTe layer 30 has a crystallographic orientation of [100], and has an epitaxial relationship to the underlying II-VI layer structure 24. In this orientation, the effective lattice parameter of the CdZnTe layer 30 for the purposes of lattice mismatch determinations is 6.46 Angstroms. The CdZnTe layer 30 is preferably from about 8 to about 10 micrometers thick. The CdZnTe layer 30 is readily formed in situ on the II-VI layer structure 24 by vapor phase deposition. The deposition of CdZnTe is well known, and is described, for example, in the publication of S. M. Johnson et al., *J. Electr. Mat.*, Vol. 22, page 835 (1993). The CdZnTe layer 30 serves to block defects produced in the underlying layers and structure from reaching the overlying layers and structure.

In each of the semiconductor articles 20 of FIGS. 1-3, a HgCdTe layer 32 overlies the CdZnTe layer 30. The HgCdTe layer 32 has a crystallographic orientation of [100], and has an epitaxial relationship to the underlying CdZnTe layer 30. In this orientation, the effective lattice parameter of the HgCdTe layer 32 for the purposes of lattice mismatch determinations is 6.46 Angstroms. The HgCdTe layer 32 is preferably from about 10 to about 15 micrometers thick. The HgCdTe layer 32 may be formed by any operable method, and is preferably epitaxially deposited on the CdZnTe layer 30 by liquid phase epitaxy (LPE). The deposition of HgCdTe by this approach is well known, and is described, for example, in the publication of T. Tung, *J. Cryst. Growth*, Vol. 86, page 161 (1988) for deposition by liquid phase epitaxy, and in the publication of O. K. Wu et al., *J. Cryst. Growth*, Vol. 127, page 365 (1993) for deposition by vapor phase epitaxy. The HgCdTe layer 32 is an active layer in an infrared sensor device.

The II-VI layer structure 24 performs the important function of lowering the interfacial lattice mismatch resulting from epitaxial strains in the semiconductor article 20. In its absence, the HgCdTe 32 would be directly adjacent to the silicon substrate 22, resulting in a 19 percent lattice mismatch if an epitaxial relation could be obtained. The prior approach has included the use of GaAs as a buffer layer between the HgCdTe 32 and the silicon substrate 22. While the prior approach is operable, the lattice mismatch is high and necessitates the use of the CdZnTe layer 30 to block interfacial defects produced at the GaAs/Si interface. The CdZnTe layer 30 has been partially effective in this role.

The introduction of the II-VI buffer layer 24 significantly reduces the incidence of defects and improves the performance of the final product. The lattice mismatch of ZnSe to silicon is only 4.2 percent, and the lattice mismatch of ZnTe to ZnSe is 7.4 percent. These smaller lattice mismatches result in the production of fewer dislocation defects at the interfaces, making the blocking layer of CdZnTe even more effective in reducing adverse consequences of defects on the HgCdTe active material.

The use of the II-VI layer structure 24 also eliminates the need for a GaAs buffer layer. In the preferred implementation of the present approach, no GaAs, III-VI compounds, or compounds other than II-VI compounds are present. This structure has the advantage that it is considerably less expensive to produce than a GaAs/Si structure. All elements in the structure are isoelectronic with the HgCdTe material. There are no non-isoelectronic contaminants or dopants present to contaminate the HgCdTe layer or its deposition source, or other types of overlying layers in other device applications. Non-isoelectronic contaminants could adversely affect subsequent thermal processing at elevated temperature or overlying coatings such as antireflective coatings. The processing permits but does not require the use of liquid phase epitaxy, and extends to other techniques such as molecular beam epitaxy and hot wall epitaxy.

The use of II-VI materials in the various layers also results in less difference in the thermal expansion coefficients of the adjacent layers, measured in the plane of the interface. Since the HgCdTe layer 32 is deposited by liquid phase epitaxy at elevated temperatures, the entire structure must be heated to those elevated temperatures. When the structure is cooled, the greater the differences in thermal expansion coefficients the greater the likelihood of production of defects at the interfaces. The similar thermal expansion coefficients of the various layers between the HgCdTe and the silicon serve to minimize the thermal contraction strain differences and to minimize the production of interfacial defects.

FIG. 4 illustrates the process for practicing the present invention. This process is utilized with the compositions, thicknesses, layers, and other features discussed previously, and that discussion is incorporated here. The silicon substrate 22 is grown, purchased, or otherwise furnished, numeral 24. The ZnSeTe (and possibly Cd) layer 24 or layers 26/28 are epitaxially deposited on the silicon substrate 22 by vapor deposition, numeral 42. The CdZnTe layer 30 is epitaxially deposited on the layer 24 by vapor phase epitaxy, numeral 44. Finally, the HgCdTe layer 32 is deposited on the CdZnTe layer 30 by any operable technique, numeral 46.

To verify the approach of the invention, specimens were prepared using the above-described approach. In a first case, a structure of 0.8 micrometers of ZnSe, 1.2 micrometers of ZnTe, and 8 micrometers of CdTe was deposited overlying the silicon substrate. In a second case, a structure of 0.8 micrometers of ZnSe, 0.6 micrometers of ZnTe, and 8.2 micrometers of $Cd_{0.96}Zn_{0.04}Te$ was deposited overlying the silicon substrate. Deposition was accomplished by MOMBE. The layers all had [100] structures with good lattice perfection, as determined by X-ray rocking curves. HgCdTe or other active structures may be deposited overlying this structure.

Although a particular embodiment of the invention has been described in detail for purposes of illustration, various modifications may be made without departing from the spirit and scope of the invention. Accordingly, the invention is not to be limited except as by the appended claims.

What is claimed is:

1. (Amended) A semiconductor article, comprising
   a silicon substrate;
   a layer comprising a II-VI compound having an epitaxial relationship to the silicon substrate, the layer of II-VI compound having a lattice parameter greater than that of silicon and further having a composition that varies according to distance from the silicon substrate;
   a layer of a CdZnTe compound having an epitaxial relationship to the layer comprising the II-VI compound, the CdZnTe compound having a lattice parameter greater than that of the II-VI compound of that portion of the layer of a II-VI compound lying adjacent to the layer of a CdZnTe compound; and
   a layer of a HgCdTe compound having an epitaxial relationship to the CdZnTe layer, the HgCdTe compound having a lattice parameter not less than that of the CdZnTe compound.

2. The semiconductor article of claim 1, wherein the layer of the II-VI compound comprises a graded layer of ZnSeTe, the graded layer having a composition of ZnSe adjacent to the silicon substrate and a composition of ZnTe adjacent to the layer of CdZnTe compound.

3. The semiconductor article of claim 1, wherein the layer of the II-VI compound comprises a graded layer of CdZnSeTe, the graded layer having a composition of ZnSe adjacent to the silicon substrate and a composition of $Cd_{0.96}Zn_{0.04}Te$ adjacent to the layer of CdZnTe compound.

4. The semiconductor article of claim 1, wherein the layer of the II-VI compound comprises two sublayers, including
   a first II-VI sublayer having an epitaxial relationship to the silicon substrate and having a composition of ZnSe, and
   a second II-VI sublayer having a composition of ZnTe and having an epitaxial relationship to the first II-VI sublayer.

5. The semiconductor article of claim 4, wherein the first II-VI sublayer has a thickness of from about 0.01 micrometer to about 1 micrometer.

6. The semiconductor article of claim 4, wherein the second II-VI sublayer has a thickness of from about 0.1 micrometer to about 1 micrometer.

7. The semiconductor article of claim 1, wherein the layer of the II-VI compound comprises two sublayers, including
   a first II-VI sublayer having an epitaxial relationship to the silicon substrate and having a composition of ZnSe, and
   a second II-VI sublayer having a graded composition of ZnTe adjacent to the first II-VI sublayer and a composition of CdZnTe adjacent to the layer of CdZnTe compound.

8. The semiconductor article of claim 1, wherein the layer of the CdZnTe compound has a thickness of from about 8 to about 10 micrometers.

9. The semiconductor article of claim 1, wherein there are no layers of III-V compounds in the semiconductor article.

10. A semiconductor article comprising
    a silicon substrate;
    an intermediate layer having an epitaxial relationship to the silicon substrate, the intermediate layer having a composition of $ZnSe_xTe_{1-x}$, where x is 1 adjacent to the silicon substrate and decreases with increasing distance from the silicon substrate;
    a semiconductor structure overlying the intermediate layer, the semiconductor structure having an epitaxial relationship to, and a lattice parameter no less than, the intermediate layer.

11. The semiconductor article of claim 10, wherein the intermediate layer includes
    a first sublayer of ZnSe having an epitaxial relationship to the silicon substrate, and
    a second sublayer of ZnTe having an epitaxial relationship to the first sublayer and lying adjacent to the semiconductor structure.

12. The semiconductor article of claim 11, wherein the first sublayer has a thickness of from about 0.01 micrometer to about 1 micrometer.

13. The semiconductor article of claim 11, wherein the second sublayer has a thickness of from about 0.1 micrometer to about 1 micrometer.

14. The semiconductor article of claim 10, wherein the intermediate layer comprises a single layer of graded composition.

15. The semiconductor article of claim 10, wherein the semiconductor structure includes a layer of a HgCdTe compound.

16. The semiconductor article of claim 10, wherein the semiconductor structure comprises
    a layer of a CdZnTe compound having an epitaxial relationship to the intermediate layer, the CdZnTe compound having a lattice parameter greater than that portion of the intermediate layer lying adjacent to the layer of a CdZnTe compound; and
    a layer of a HgCdTe compound having an epitaxial relationship to the CdZnTe layer, the HgCdTe compound having a lattice parameter not less than that of the CdZnTe compound.

17. The semiconductor article of claim 10, wherein the semiconductor structure includes a layer of a II-VI semiconductor compound.

* * * * *